(12) United States Patent
Ryu

(10) Patent No.: US 12,009,255 B2
(45) Date of Patent: Jun. 11, 2024

(54) METHOD OF MANUFACTURING SEMICONDUCTOR DEVICE INCLUDING LASER TREATMENT FOR CONTACT PLUG

(71) Applicant: RNR LAB INC., Seoul (KR)

(72) Inventor: Jeong Do Ryu, Seoul (KR)

(73) Assignee: RNR LAB INC., Seoul (KR)

( * ) Notice: Subject to any disclaimer, the term of this patent is extended or adjusted under 35 U.S.C. 154(b) by 635 days.

(21) Appl. No.: 17/281,966

(22) PCT Filed: Aug. 26, 2019

(86) PCT No.: PCT/KR2019/010846
§ 371 (c)(1),
(2) Date: Mar. 31, 2021

(87) PCT Pub. No.: WO2020/071638
PCT Pub. Date: Apr. 9, 2020

(65) Prior Publication Data
US 2021/0375676 A1     Dec. 2, 2021

(30) Foreign Application Priority Data
Oct. 4, 2018   (KR) .................. 10-2018-0118311

(51) Int. Cl.
*H01L 21/768*     (2006.01)

(52) U.S. Cl.
CPC .. *H01L 21/76882* (2013.01); *H01L 21/76807* (2013.01); *H01L 21/76894* (2013.01)

(58) Field of Classification Search
CPC ........ H01L 21/76882–76883; H01L 21/76894
See application file for complete search history.

(56) References Cited

U.S. PATENT DOCUMENTS

| | | | |
|---|---|---|---|
| 7,211,502 B2 * | 5/2007 | Yamazaki | G02F 1/136227 438/597 |
| 8,299,365 B2 * | 10/2012 | Nguyen | H01L 21/76849 174/257 |
| 2006/0223311 A1 * | 10/2006 | Buchholtz | H01L 21/76877 257/E21.585 |
| 2018/0130702 A1 * | 5/2018 | Patil | H01L 23/53209 |

* cited by examiner

*Primary Examiner* — Daniel Luke
(74) *Attorney, Agent, or Firm* — McLean IP Global; Jason Y. Pahng

(57) ABSTRACT

A method of manufacturing a semiconductor device comprises providing a substrate; forming an insulating layer on the substrate; etching the insulating layer to form an opening that exposes the substrate; forming a contact plug in the opening and on the insulating layer; forming a metal layer on the contact plug; and irradiating the metal layer with a laser.

8 Claims, 3 Drawing Sheets

METHOD OF MANUFACTURING SEMICONDUCTOR DEVICE INCLUDING LASER TREATMENT FOR CONTACT PLUG

This application claims priority from Korean application number 10-2018-0118311, filed on Oct. 4, 2018, which is hereby incorporated by reference in its entirety.

BACKGROUND OF THE INVENTION

1. Field

The present invention relates to a method of manufacturing a semiconductor device.

2. Description of the Related Art

Semiconductor memory devices may be classified into volatile memory devices and non-volatile memory devices. The volatile memory devices typically include dynamic random access memory (DRAM) devices or static random access memory (SRAM) devices. A representative non-volatile memory device may be a flash memory device.

Meanwhile, as the electronics industry is being developed, the semiconductor devices become so highly integrated that a reliable contact plug may be required for electrical connection between upper and lower patterns in manufacturing process of a semiconductor device.

However, in the case of forming the contact plug according to conventional methods, voids are generated in the contact plug, and these voids are exposed to the outside in a subsequent process, resulting in a surface defect such as a seam, thereby degrading device characteristics, such as an increase in line resistance.

[Related Prior Art] KR patent no. 10-0465063

DISCLOSURE OF THE INVENTION

Technical Problem

In order to solve the above problems, the present invention is directed to providing a method of manufacturing a semiconductor device including a contact plug from which voids or seams are removed.

However, the technical problem to be achieved by the present embodiment is not limited to the technical problems described above, and other technical problems may exist.

Technical Solution

As a technical means for achieving the above-described technical problem, an embodiment of the present invention may provide a method of manufacturing a semiconductor device which includes: providing a substrate; forming an insulating layer on the substrate; etching the insulating layer to form an opening exposing the substrate, forming a contact plug in the opening and on the insulating layer; forming a metal layer on the contact plug; and irradiating the metal layer with a laser.

According to one embodiment, the method may further include removing the metal layer.

According to one embodiment, the irradiating of the metal layer with a laser may include removing a void or a seam in the contact plug by directly heating the metal layer, resulting in indirectly heating the contact plug.

According to one embodiment, the insulating layer may include at least one of an oxide, a nitride, and an oxynitride.

According to one embodiment, the opening may include at least one damascene pattern, a via hole, and a trench.

According to one embodiment, the contact plug may include polysilicon or a metal.

According to one embodiment, the metal layer may include at least one of titanium (Ti), titanium nitride (TiN), titanium s (TiSi), tantalum (Ta), tantalum nitride (TaN), cobalt (Co), cobalt silicide (CoSi), nickel (Ni), nickel silicide (NiSi), ruthenium (Ru), tungsten (W), tungsten silicide (WSi), copper (Cu), rhenium (Re), molybdenum (Mo), niobium (Nb), and chromium (Cr).

According to one embodiment, the contact plug may include a material containing an inorganic material.

According to one embodiment, the laser may be a YAG laser, a diode laser, a $CO_2$ laser, or a fiber laser.

Effects of the Invention

According to any one of the above-described problem solving means of the present invention, a semiconductor device having low resistance characteristics can be provided by removing voids or seams in a contact plug. In addition, in a process of removing the voids or seams, an processed object can be recrystallized during melting and solidifying processes, thereby providing a semiconductor device having a lower resistance characteristic.

MODES FOR CARRYING OUT THE INVENTION

Figure 1:
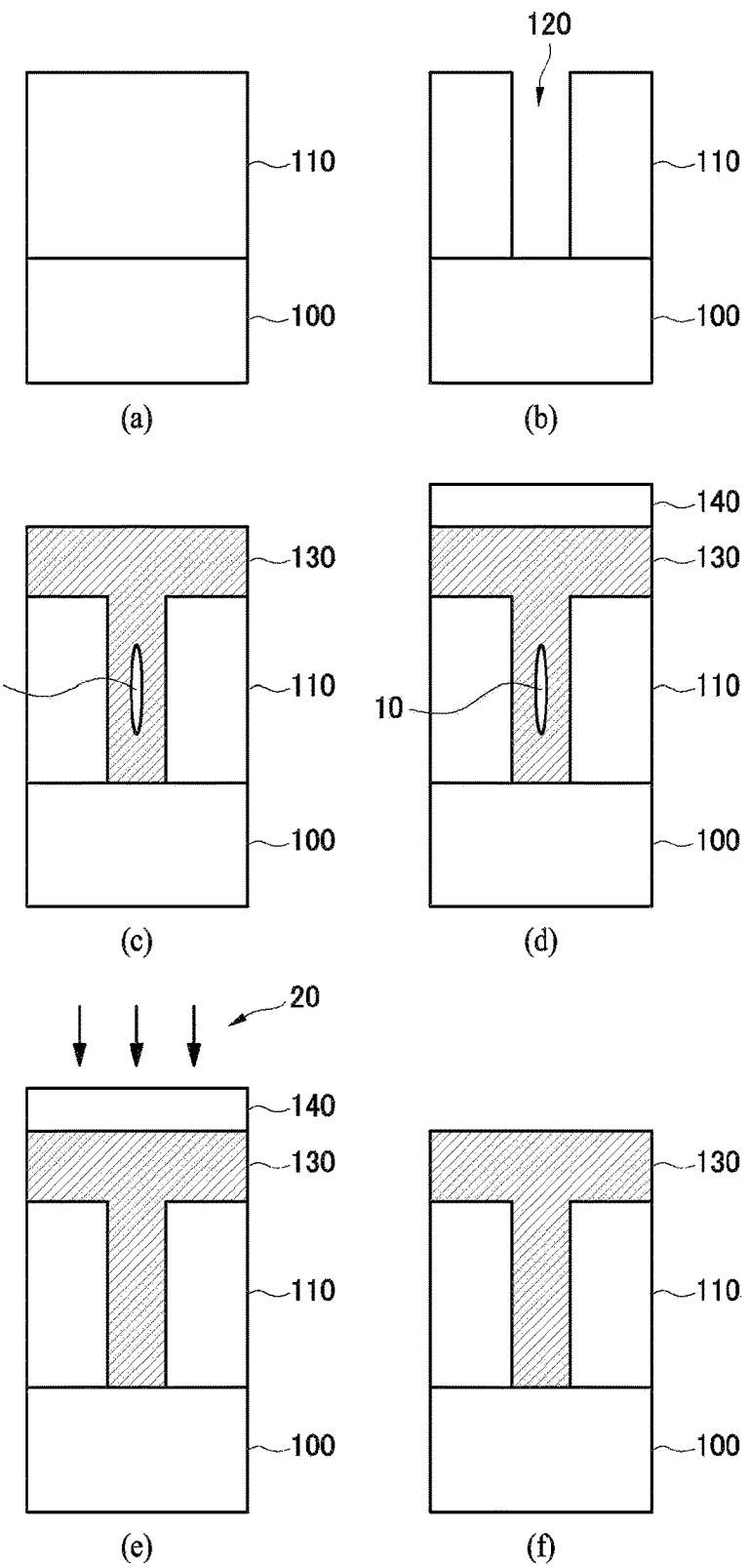
FIG. 1 is a diagram for describing a method of manufacturing a semiconductor device according to one embodiment of the present invention.

Embodiments of the present invention will now be described in detail with reference to the accompanying drawings so that those skilled in the art may readily practice the present invention. However, the present invention may be embodied in many different forms and is not limited to the embodiments described herein. In the drawings, parts that are not relevant to the description are omitted in order to clearly describe the present invention, and similar parts are denoted by similar reference numerals throughout the specification.

Throughout the specification, when a part is referred to as being "connected" to another part, this includes not only the case of being "directly connected" to another part but also the case of being "electrically connected" to another element with still another part disposed therebetween. It should also be understood that when a part "comprises or includes" a component, it does not exclude other components but may further includes other components unless specifically stated to the contrary, and does not preclude the presence or addition of one or more other features or numbers, steps, operations, components, parts or combinations thereof.

In the present specification, the term "unit" includes a unit implemented by hardware, a unit implemented by software, and a unit implemented using both of them. In addition, one unit may be implemented using two or more pieces of hardware, or two more units may be implemented with one piece of hardware.

One embodiment of the present invention will be described in detail with reference to the accompanying drawings.

FIG. 1 is a diagram for describing a method of manufacturing a semiconductor device according to one embodiment of the present invention.

Referring to FIG. 1, a substrate 100 is provided (see (a) in FIG. 1). For example, the substrate 100 may include at least one selected from silicon (Si) or germanium (Ge).

Then, an insulating layer 110 may be formed on the substrate 100 (see (a) in FIG. 1). The insulating layer 110 may be formed by chemical vapor deposition (CVD) or physical vapor deposition (PVD).

The insulating layer 110 may include at least one of an oxide, a nitride, and an oxynitride.

Subsequently, an opening 120 exposing the substrate is formed by etching the insulating layer 110 (see (b) in FIG. 1). The opening 120 may be a dual damascene pattern, a via hole, or a trench.

Here, a resist pattern (not shown) may be formed on the insulating layer 110, and the opening 120 may be formed by etching the insulating layer 110 using the resist pattern as a mask.

In this case, the etching process may be performed by at least one selected from a chemical dry etching process and a wet etching process.

Next, a contact plug 130 may be formed on the opening 120 and the insulating layer 110 (see (c) in FIG. 1). Here, the contact plug 130 may be formed by CVD or PVD and may include polysilicon (e.g., amorphous-Si) or a metal.

Here, a void or seam 10 may be present in the contact plug 130. Such a void or seam causes an increase in line resistance, thereby degrading device performance.

There is a method of irradiating the contact plug 130 with a laser in order to remove the void or seam in the contact plug 130.

That is, when the contact plug 130 is irradiated with a laser 20, the contact plug 130 is melted and then re-solidified into a solid, wherein atoms may be rearranged into a crystalline state having high crystallinity. Accordingly, a grain size is also increased, and thus the void or seam in the contact plugs 130 may be removed.

Figure 2:
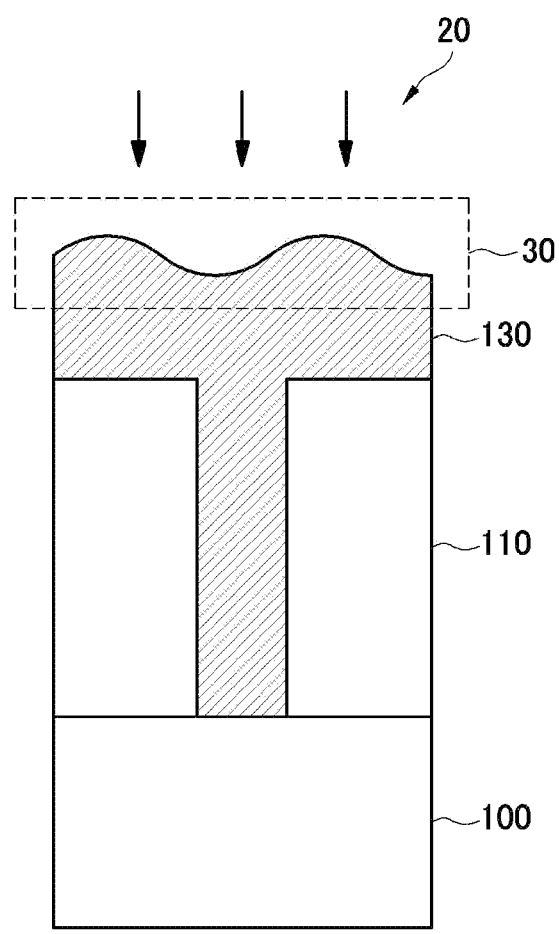
FIG. 2 is a diagram for describing a contact plug that is irradiated with a laser.

In this regard, FIG. 2 is a diagram for describing the contact plug that is irradiated with a laser.

Referring to FIG. 2, when the contact plug 130 is directly irradiated with the laser 20, there is a problem that the contact plug 130 is heated and protrusions 30 are generated at an irradiation site of the laser 20. The reason protrusion occurs is that when the melted material is solidified, recrystallization occurs and at this time grains are formed. Impurity concentration may be increased in a grain boundary between crystal grains, and thus the solidification time of grain boundaries may be longer than that of the center of the grain, thereby causing the protrusion to occur between the grain boundaries.

Therefore, in the present invention, the above-described problem can be solved by forming a metal layer 140 on the contact plug 130, and indirectly heating the contact plug 130 by directly irradiating the metal layer 140.

In addition, since a metal has relatively many free electrons, the metal may be heated at very high temperature 2000 to 3000° C.) by a laser. In contrast, it is relatively difficult to heat materials containing inorganic materials (e.g., $SiO_2$, Si, or $Si_3N_4$) through the laser.

By the present invention utilizing these features, the contact plug 130 may be effectively heated by directly irradiating the metal layer 140 with a laser to indirectly heat the contact plug 130 after the metal layer 140 and the contact plug 130 are disposed adjacent to each other (e.g., in contact with each other).

Specifically, the metal layer 140 may be formed on the contact plug 130 (see (d) in FIG. 1). Here, the metal layer 130 may include at least one of titanium (Ti), titanium nitride (TiN), titanium silicide (TiSi), tantalum (Ta), tantalum nitride (TaN), cobalt (Co), cobalt silicide (CoSi), nickel (Ni), nickel silicide (NiSi), ruthenium (Ru), tungsten (W), tungsten silicide (WSi), copper (Cu), rhenium (Re), molybdenum (Mo), niobium (Nb), and chromium (Cr).

In this case, the materials of the contact plug 130 and the metal layer 140 may be selected such that heat generated by irradiating the metal layer 140 with the laser 20 is greater than heat generated by irradiating the contact plug 130 with the laser 20 and accordingly the contact plug 130 may be effectively indirectly heated. For example, the contact plug 130 may include a material containing an inorganic material (e.g., $SiO_2$, Si, or $Si_3N_4$).

Next, the metal layer 140 may be irradiated with the laser 20 (see (e) in FIG. 1). The laser 20 may be a YAG laser, a diode laser, a $CO_2$ laser, or a fiber laser.

The metal layer 140 is directly heated and the contact plug 130 adjacent to the metal layer 140 is indirectly heated by irradiating the metal layer 140 with the laser 20.

In this case, the contact plug 130 is indirectly heated to proceed with the recrystallization process thereof, and the grain size is also increased, thereby removing the void or seam in the contact plug 130.

As such, since the void or seam 10 in the contact plug 130 is removed, the semiconductor device has a low resistance characteristic.

In this case, a reaction or interdiffusion between the metal layer 140 and the contact plug 130 due to high-temperature heating may occur, and one or more materials capable of preventing the reaction or interdiffusion may be inserted between the metal layer 140 and the contact plug 130. This is because, when the reaction or interdiffusion occurs, removal of the metal layer 140 may not be easy in a step of removing the metal layer 140, which will be described below.

Such a material may include, for example, one of $SiO_2$, $Si_3N_4$, polysilicon, and amorphous-Si.

After the void or seam 10 in the contact plug 130 is removed, the metal layer 140 may be removed (see (e) in FIG. 1).

Figure 3:
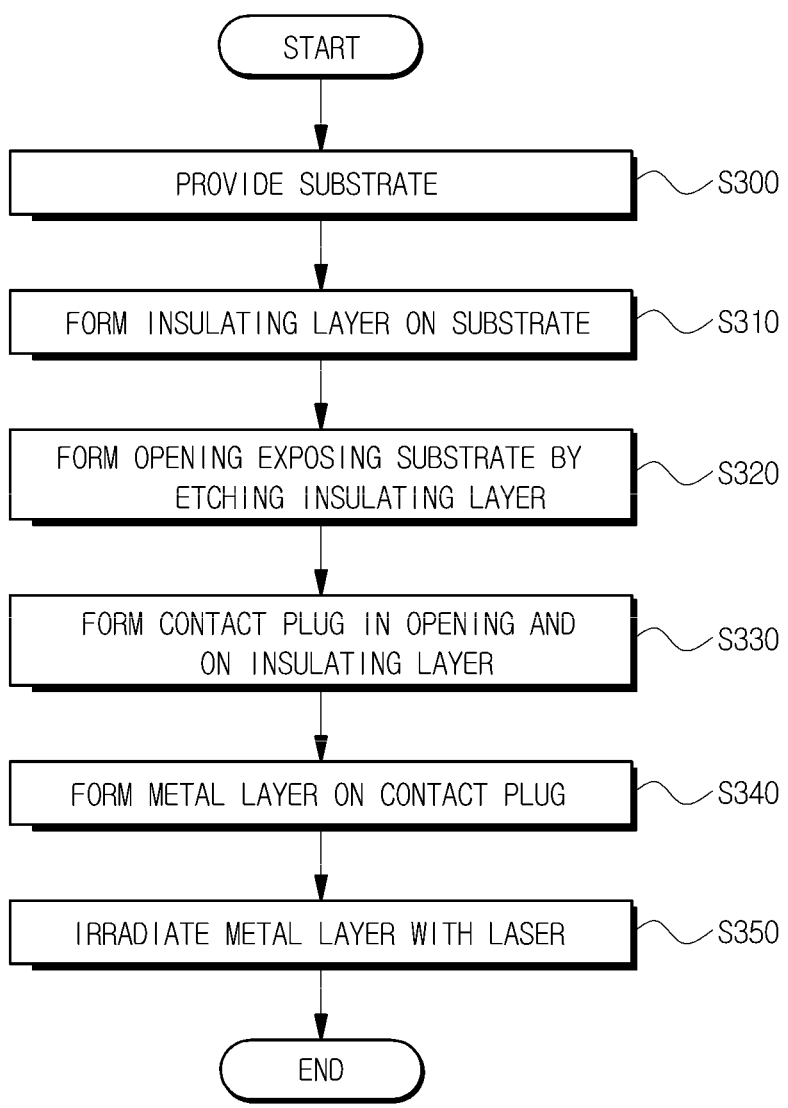
FIG. 3 is a flowchart illustrating a method of manufacturing a semiconductor device according to one embodiment of the present invention.

FIG. 3 is a flowchart illustrating a method of manufacturing a semiconductor device according to one embodiment of the present invention.

Referring to FIG. 3, a substrate is provided in step S300. In step S310, an insulating layer is formed on the substrate.

In step S320, an opening exposing the substrate is formed by etching the insulating layer.

In step S330, a contact plug is formed in the opening and on the insulating layer. In step S340, a metal layer is formed on the contact plug.

In step S350, the metal layer is irradiated with a laser.

The foregoing description of the present invention is intended to be illustrative, and it will be understood by those skilled in the art that modifications may be readily made to other specific forms without departing from the spirit or essential characteristics of the present invention. It should therefore be understood that the embodiments described above are illustrative in all respects and not, restrictive. For example, each component described in a single form may be implemented in a distributed fashion, and components described as being distributed may also be implemented in a combined fashion.

The scope of the present invention is indicated by the following claims rather than the above description, and all changes or modifications derived from the meaning and scope of claims and their equivalents are to be construed as being included in the scope of present invention.

What is claimed is:

1. A method of manufacturing a semiconductor device, the method comprising:
    providing a substrate;
    forming an insulating layer on the substrate;
    etching the insulating layer to form an opening that exposes the substrate;
    forming a contact plug in the opening and on the insulating layer;
    forming a metal layer on the contact plug; and
    irradiating the metal layer with a laser,
    wherein the irradiating of the metal layer with a laser comprises removing a void or a seam in the contact plug by directly heating the metal layer, resulting in Indirectly heating the contact plug, and
    wherein the method further comprises forming an insertion layer between the contact plug and the metal layer to prevent reaction or interdiffusion therebetween, and the irradiating of the metal layer with a laser is performed in a state where the insertion layer and the metal layer are disposed on the contact plug.

2. The method of claim 1, further comprising removing the metal layer.

3. The method of claim 1, wherein the insulating layer comprises at least one of an oxide, a nitride, and an oxynitride.

4. The method of claim 1, wherein the opening is a dual damascene pattern, a via hole, or a trench.

5. The method of claim 1, wherein the contact plug comprises polysilicon or a metal.

6. The method of claim 1, wherein the metal layer comprises at least one of titanium (Ti), titanium nitride (TIN), titanium silicide (TiSi), tantalum (Ta), tantalum nitride (TaN), cobalt (Co), cobalt silicide (CoSi), nickel (Ni), nickel silicide (NiSi), ruthenium (Ru), tungsten (W), tungsten silicide (WSi), copper (Cu), rhenium (Re), molybdenum (Mo), niobium (Nb), and chromium (Cr).

7. The method of claim 6, wherein the contact plug comprises a material containing an inorganic material.

8. The method of claim 1, wherein the laser is a YAG laser, a diode laser, a $CO_2$ laser, or a fiber laser.

* * * * *